(12) United States Patent
Sakamoto (10) Patent No.: US 11,515,801 B2
(45) Date of Patent: Nov. 29, 2022

(54) SHIELD IN A POWER CONVERSION DEVICE (71) Applicant: Mitsubishi Electric Corporation, Tokyo (JP)

(72) Inventor: Tatsuro Sakamoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 73 days.

(21) Appl. No.: 17/051,021

(22) PCT Filed: Apr. 1, 2019

(86) PCT No.: PCT/JP2019/014504
§ 371 (c)(1),
(2) Date: Oct. 27, 2020

(87) PCT Pub. No.: WO2020/003674
PCT Pub. Date: Jan. 2, 2020

(65) Prior Publication Data
US 2021/0143745 A1 May 13, 2021

(30) Foreign Application Priority Data
Jun. 26, 2018 (JP) .............................. JP2018-120984

(51) Int. Cl.
*H02M 7/00* (2006.01)
*G01R 15/20* (2006.01)
(Continued)

(52) U.S. Cl.
CPC .......... *H02M 7/003* (2013.01); *G01R 15/207* (2013.01); *G01R 19/0092* (2013.01);
(Continued)

(58) Field of Classification Search
CPC .... H02M 7/003; H02M 3/003; H02M 1/0009; H02M 1/0064; H02M 1/007; H02M 3/1586; G01R 19/0092
See application file for complete search history.

(56) References Cited

U.S. PATENT DOCUMENTS 10,088,505 B2 * 10/2018 Okuyama ............ G01R 33/025
10,794,935 B2 * 10/2020 Okuyama ............ G01R 15/205
(Continued)

FOREIGN PATENT DOCUMENTS

JP     2016200549 A    12/2016
JP     2017-151126 A    8/2017
(Continued)

OTHER PUBLICATIONS

International Search Report for PCT/JP2019/014504 dated May 28, 2019 [PCT/ISA/210].
(Continued)

*Primary Examiner* — Yusef A Ahmed
(74) *Attorney, Agent, or Firm* — Sughrue Mion, PLLC; Richard C. Turner (57) ABSTRACT

A power conversion device which is premised on converting electric power supplied from a power source with use of a magnetic component, includes: a plurality of bus bars configured to supply electric power to a load; current sensor elements which are respectively provided for the plurality of bus bars, and are configured to detect magnetic fluxes generated when electric currents flow through the plurality of bus bars; and a plate-like magnetic shield plate which is arranged on a straight line connecting the magnetic component and the current sensor element, and is configured to shield magnetic fluxes directed from the magnetic component to one or more current sensor elements.

20 Claims, 6 Drawing Sheets

(51) Int. Cl.
*G01R 19/00* (2006.01)
*H02M 7/48* (2007.01)
*H02M 3/00* (2006.01)
*H02M 1/00* (2006.01)

(52) U.S. Cl.
CPC .............. *H02M 3/003* (2021.05); *H02M 7/48* (2013.01); *H02M 1/0009* (2021.05); *H02M 1/0064* (2021.05)

(56) References Cited

U.S. PATENT DOCUMENTS

| | | | |
|---|---|---|---|
| 2002/0148830 A1* | 10/2002 | Ross | H05B 6/104 |
| | | | 219/645 |
| 2006/0082357 A1* | 4/2006 | Tsukamoto | G01R 15/20 |
| | | | 324/126 |
| 2009/0023345 A1* | 1/2009 | Matsumoto | H01R 25/162 |
| | | | 439/720 |
| 2011/0221430 A1* | 9/2011 | Ito | G01R 15/207 |
| | | | 324/244 |
| 2015/0084422 A1* | 3/2015 | Ishigaki | H02M 7/4837 |
| | | | 307/43 |
| 2015/0260762 A1* | 9/2015 | Sakamoto | G01R 15/207 |
| | | | 324/117 R |
| 2017/0082659 A1* | 3/2017 | Harada | G01R 15/20 |
| 2017/0285075 A1* | 10/2017 | Okuyama | G01R 33/093 |
| 2017/0285076 A1* | 10/2017 | Okuyama | G01R 33/093 |
| 2017/0370969 A1* | 12/2017 | Okuyama | G01R 15/205 |
| 2018/0031613 A1* | 2/2018 | Nakayama | G01R 19/25 |
| 2018/0284162 A1* | 10/2018 | Okuyama | G01R 15/205 |
| 2018/0348261 A1* | 12/2018 | Okamoto | G01R 15/202 |
| 2019/0170794 A1* | 6/2019 | Okuyama | G01R 15/207 |
| 2019/0187183 A1* | 6/2019 | Okuyama | G01R 19/0092 |
| 2019/0187187 A1* | 6/2019 | Umetsu | G01R 1/04 |
| 2019/0250193 A1* | 8/2019 | Futakuchi | G01R 33/072 |
| 2020/0018804 A1* | 1/2020 | Okuyama | G01R 15/207 |
| 2020/0025803 A1* | 1/2020 | Esaka | G01R 15/148 |
| 2020/0203064 A1* | 6/2020 | Sakamoto | H01F 27/366 |
| 2020/0271696 A1* | 8/2020 | Nakada | G01R 31/42 |
| 2020/0300895 A1* | 9/2020 | Tamura | G01R 15/207 |
| 2020/0389049 A1* | 12/2020 | Kunii | H01F 37/00 |
| 2021/0003617 A1* | 1/2021 | Esaka | G01R 15/207 |
| 2021/0048454 A1* | 2/2021 | Choi | G01R 1/203 |
| 2021/0211054 A1* | 7/2021 | Kawamura | H02M 3/1584 |
| 2022/0229093 A1* | 7/2022 | Tamura | G01R 15/20 |
| 2022/0229094 A1* | 7/2022 | Tamura | G01R 19/0092 |

FOREIGN PATENT DOCUMENTS

| | | |
|---|---|---|
| JP | 2017-204981 A | 11/2017 |
| JP | 2018080944 A | 5/2018 |

OTHER PUBLICATIONS

Written Opinion for PCT/JP2019/014504 dated May 28, 2019 [PCT/ISA/237].

Communication dated Jul. 22, 2021, from the European Patent Office in application No. 19824600.1.

* cited by examiner

SHIELD IN A POWER CONVERSION DEVICE

CROSS REFERENCE TO RELATED APPLICATIONS

This application is a National Stage of International Application No. PCT/JP2019/014504 filed Apr. 1, 2019, claiming priority based on Japanese Patent Application No. 2018-120984 filed Jun. 26, 2018.

TECHNICAL FIELD

The present invention relates to a power conversion device configured to convert electric power supplied from a power source with use of a magnetic component.

BACKGROUND ART

For example, a power conversion device having a large electric power capacity to be mounted on electrically driven vehicles such as an electric vehicle and a plug-in hybrid often includes a bus bar and a current sensor configured to detect an amount of electric current flowing through the bus bar. The bus bar is a conductor member formed of a metal plate or a metal bar, and is used on a current path having a large amount of electric current.

The electric current flowing through the bus bar generates magnetic fluxes. The current sensor includes a magnetic detection element, and the magnetic detection element is arranged adjacent to the bus bar. A value of the electric current flowing through the bus bar is calculated through multiplication of a signal value corresponding to the number of magnetic fluxes, which is output by the magnetic detection element, by a coefficient. The magnetic detection element is hereinafter referred to as a "current sensor element."

A disturbance magnetic field, which generates magnetic fluxes other than the bus bar to be measured, often affects the signal value of the current sensor element, that is, a detection value of the number of magnetic fluxes. Therefore, in an environment in which the disturbance magnetic field is strong, it is difficult to detect the value of the electric current flowing through the bus bar with high accuracy. To address this problem, it has been proposed to provide magnetic shield materials along the bus bar so as to surround the current sensor element to reduce the effect of the disturbance magnetic field and maintain the accuracy of the current sensor (see, for example, Patent Literature 1).

In a power conversion device configured to convert electric power with the use of a reactor, the reactor generates a strong magnetic field. A magnetosensitive direction in which the current sensor element can detect the magnetic fluxes is limited. To address this problem, it has also been proposed to arrange a current sensor element with respect to the reactor so that the magnetic fluxes generated by the reactor are orthogonal to the magnetosensitive direction (see, for example, Patent Literature 2).

CITATION LIST

Patent Literature

[PTL 1] JP 2017-151126 A1
[PTL 2] JP 2017-204981 A1

SUMMARY OF INVENTION

Technical Problem

Even when a magnetic shield is provided along the bus bar so as to surround the current sensor element, depending on a positional relationship between a direction of the magnetic fluxes generated by the disturbance magnetic field and the magnetic shield materials, a sufficient shielding effect cannot be obtained. In other words, in order to obtain the sufficient shielding effect, it is required to set an appropriate positional relationship between a magnetic component that generates the disturbance magnetic field and the bus bar.

However, when the positional relationship between the magnetic component and the bus bar is defined, design flexibility is reduced. With its use for supplying electric power in a load, the power conversion device is rarely commercialized as a discrete device. Therefore, in many cases, there are quite a few conditions to be satisfied. In view of this, it is preferred to ensure more design flexibility.

The present invention has been made to solve the above-mentioned problems, and therefore has an object to provide a power conversion device capable of detecting an electric current with high accuracy while ensuring design flexibility.

Solution to Problem

A power conversion device according to the present invention is premised on converting electric power supplied from a power source with use of a magnetic component, and includes: a plurality of bus bars configured to supply electric power to a load; current sensor elements which are respectively provided for the plurality of bus bars, and are configured to detect magnetic fluxes generated when electric currents flow through the plurality of bus bars; and a plate-like magnetic shield plate which is arranged on a straight line connecting the magnetic component and the current sensor element, and is configured to shield magnetic fluxes directed from the magnetic component to one or more current sensor elements.

Advantageous Effects of Invention

According to the present invention, it is possible to detect the electric current with the high accuracy while ensuring the design flexibility.

DESCRIPTION OF EMBODIMENTS

Referring to the drawings, a power conversion device according to each embodiment of the present invention is described below.

First Embodiment

Figure 1:
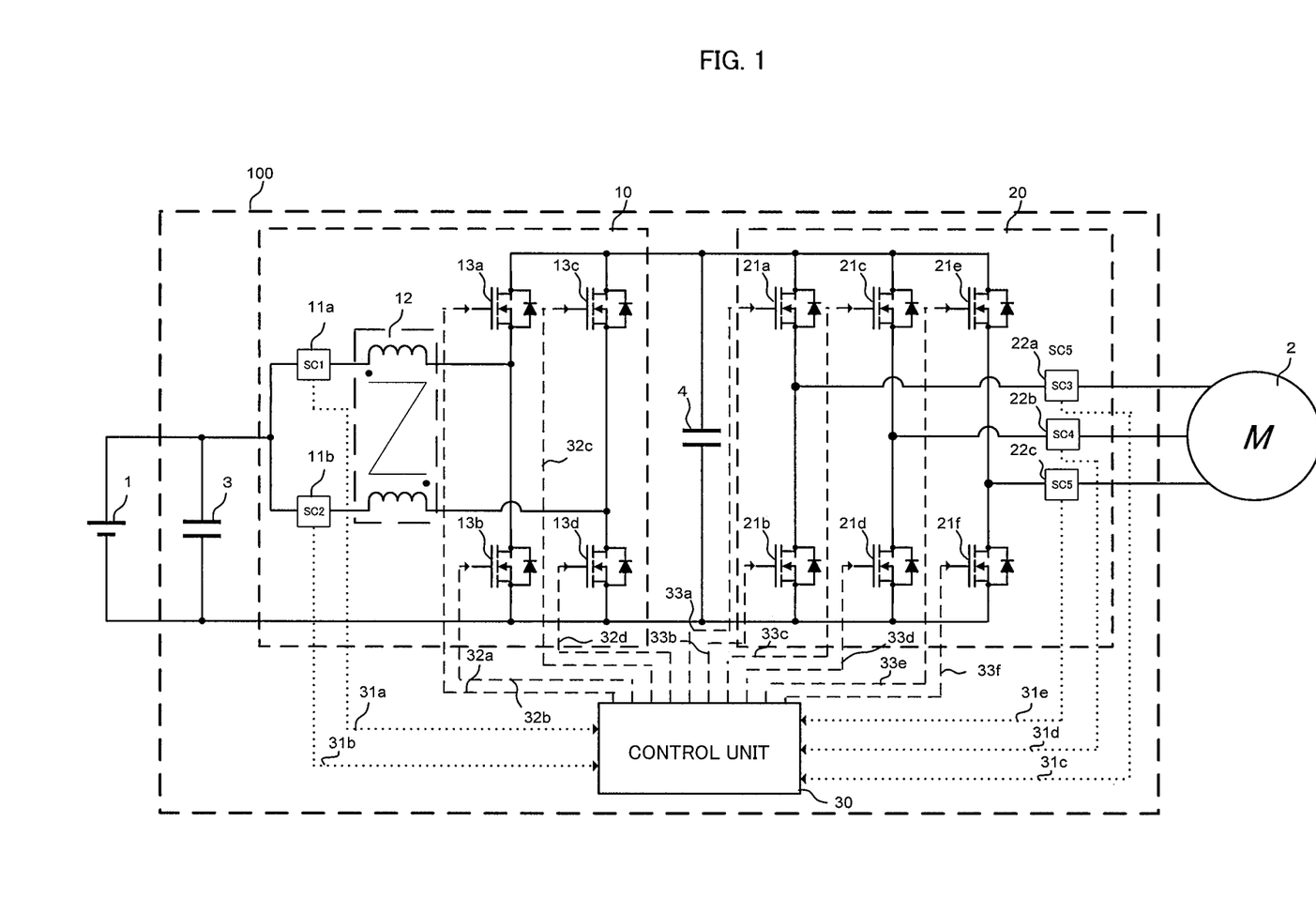
FIG. 1 is a diagram for illustrating a circuit configuration example of a power conversion device according to a first embodiment of the present invention.

FIG. 1 is a diagram for illustrating a circuit configuration example of a power conversion device according to a first embodiment of the present invention.

The power conversion device, which is denoted by 100, is a device configured to convert electric power supplied from a power source 1 to have different electric amounts, that is, voltage, current, frequency, phase, and phase number, and includes a direct current (DC)/DC step-up converter circuit 10 and an inverter circuit 20. To an input stage of the DC/DC step-up converter circuit 10, an input power smoothing capacitor 3 is connected, and the DC/DC step-up converter circuit 10 and the inverter circuit 20 are connected to each other via a link capacitor 4.

The DC/DC step-up converter circuit 10 includes current sensor elements 11a and 11b, a step-up reactor 12, and semiconductor switching elements 13a to 13d.

Figure 2:
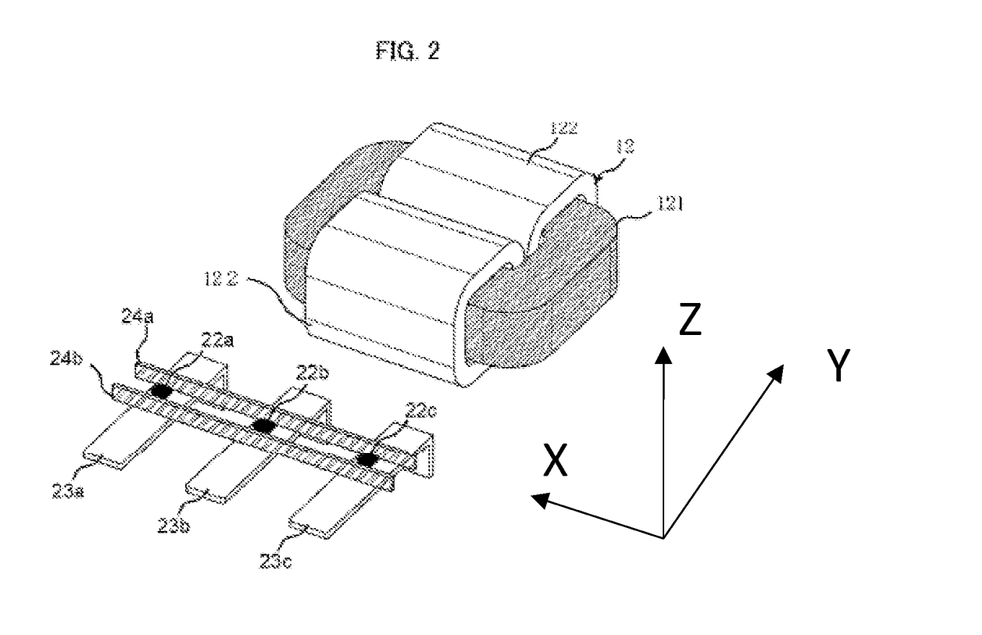
FIG. 2 is a perspective view for illustrating an example of a positional relationship between a step-up reactor and current sensor elements for electric currents supplied to a load.

As illustrated in FIG. 2, the step-up reactor 12 is a magnetic-coupling magnetic component, which includes a magnetic core 121 and two windings 122 having a turn ratio of 1:1, and in which the windings 122 are wound so that generated magnetic fluxes cancel each other in the magnetic core. The current sensor elements 11a and 11b are elements configured to output signals corresponding to the magnetic fluxes generated by electric currents, and are used to individually measure electric currents flowing through the windings 122. A current value is obtained by multiplying a sampled signal value by a coefficient.

In the first embodiment, as each of the semiconductor switching elements 13a to 13d, a metal-oxide-semiconductor field effect transistor (MOSFET) is adopted. To both ends of the link capacitor 4, the semiconductor switching elements 13a and 13b, and the semiconductor switching elements 13c and 13d are connected in parallel. The semiconductor switching elements 13a and 13b are connected in series with each other. The semiconductor switching elements 13c and 13d are similarly connected in series with each other. The type of the element to be used as each of the semiconductor switching elements 13a to 13d is not particularly limited. In other words, each of the semiconductor switching elements 13a to 13d may be an insulated gate bipolar transistor (IGBT), for example.

The link capacitor 4 has a positive terminal connected to a drain of each of the semiconductor switching elements 13a and 13c, and the semiconductor switching elements 13a and 13c have sources connected to drains of the semiconductor switching elements 13b and 13d, respectively. Each of the semiconductor switching elements 13b and 13d has a source connected to a negative terminal of the link capacitor 4.

Each of the windings 122 of the step-up reactor 12 has one end connected to a positive pole of the power source 1. One of the two windings 122 has the other end connected to the source of the semiconductor switching element 13a, and the other of the two windings 122 has the other end connected to the source of the semiconductor switching element 13c. The semiconductor switching elements 13a to 13d have gates connected to a control unit 30 via control lines 32a to 32d, respectively.

The DC/DC step-up converter circuit 10 is an interleaved converter circuit, and is configured to convert DC power supplied by the power source 1 into DC power having a higher voltage. This power conversion is achieved by the control unit 30 controlling the semiconductor switching elements 13a to 13d to be turned on/off.

The inverter circuit 20 is used to supply electric power for driving a load 2, and is configured to convert the DC power output by the DC/DC step-up converter circuit 10 into three-phase AC power. To this end, to both ends of the link capacitor 4, semiconductor switching elements 21a and 21b, semiconductor switching elements 21c and 21d, and semiconductor switching elements 21e and 21f are connected in parallel. The semiconductor switching elements 21a and 21b are connected in series with each other to both ends of the link capacitor 4. In other words, the semiconductor switching element 21a has a drain connected to the positive terminal of the link capacitor 4, the semiconductor switching element 21a has a source connected to a drain of the semiconductor switching element 21b, and the semiconductor switching element 21b has a source connected to the negative terminal of the link capacitor 4. The same is true for the semiconductor switching elements 21c and 21d, and for the semiconductor switching elements 21e and 21f.

The semiconductor switching elements 21a to 21f have gates connected to the control unit 30 via control lines 33a to 33f, respectively. With this configuration, the control unit 30 is configured to control the semiconductor switching elements 21a to 21f to be turned on/off. As a result, the three-phase AC power is supplied to the load 2 so that the load 2 is driven.

The load 2 is connected to the sources of the semiconductor switching elements 21a, 21c, and 21e. Therefore, electric power of one phase is supplied when the semiconductor switching element 21a is on and the semiconductor switching element 21b is off. Electric power of another phase is supplied when the semiconductor switching element 21c is on and the semiconductor switching element 21d is off. Electric power of the last phase is supplied when the semiconductor switching element 21e is on and the semiconductor switching element 21f is off.

Current sensor elements 22a to 22c are provided for different phases in which the electric power is supplied to the load 2. The current sensor elements 22a to 22c are the same as the above-mentioned current sensor elements 11a and 11b. Current values of respective phases detected by the current sensor elements 22a to 22c are used as information for driving the load 2 appropriately by the control unit 30. In other words, the control unit 30 is configured to control the semiconductor switching elements 21a to 21f to be turned on/off with the use of the current values detected in the respective phases.

The current sensor elements 22a to 22c are connected to the control unit 30 via control lines 31c to 31e, respectively. The current sensor elements 11a and 11b for electric currents flowing through the step-up reactor 12 are similarly connected to the control unit 30 via control lines 31a and 31b, respectively. To the control unit 30, signal values output by the current sensor elements 11a, 11b, and 22a to 22c are input via the control lines 31a to 31e, respectively. The control unit 30 is configured to calculate a current value by multiplying each of the input signal values by a predetermined coefficient. The control unit 30 is configured to reflect the thus-obtained current values on the control.

Both of the DC/DC step-up converter circuit 10 and the inverter circuit 20 are known circuits. Therefore, a more detailed description thereof is omitted.

FIG. 2 is a perspective view for illustrating an example of a positional relationship between the step-up reactor and the current sensor elements for electric currents supplied to the load. A three-dimensional set of axes including X direction, Y direction and Z direction is shown in FIG. 2. Electric currents are supplied from the inverter circuit 20 to the load 2 through bus bars 23a to 23c. The current sensor elements 22a to 22c are mounted adjacent to the bus bars 23a to 23c, respectively, as illustrated in FIG. 2.

Each of the current sensor elements 22a to 22c is an element configured to output a signal corresponding to a magnetic flux as described above. In order to detect electric currents flowing through the bus bars 23a to 23c with high accuracy, it is required to make the current sensor elements 22a to 22c detect only magnetic fluxes generated by the bus bars 23a to 23c, respectively. However, in the power conversion device 100, there is a disturbance magnetic field that generates magnetic fluxes other than the magnetic fluxes as targets. In the power conversion device 100, the step-up reactor 12 is a magnetic component that generates the strongest disturbance magnetic field. Therefore, in FIG. 2, the example of the positional relationship between the step-up reactor 12 and the current sensor elements 22a to 22c is illustrated.

In the first embodiment, as illustrated in FIG. 2, two magnetic shield plates 24a and 24b are arranged to be opposed to each other so as to sandwich the current sensor elements 22a to 22c. Each of the magnetic shield plates 24a and 24b is a member made of a magnetic material having a high relative permeability for shielding magnetic fluxes. As the magnetic material, a material having a relative permeability of 3,000 or more is preferred. Examples of the magnetic material satisfying the condition include permalloy, ferrite, Fe-6.5Si, Fe-3.5Si, an Fe-based amorphous alloy, a nanocrystalline Fe-based alloy, a soft magnetic material, and a silicon steel plate.

Hereinafter, a magnetic shield plate that does not require identification is denoted by a reference numeral "24" for convenience of description. Similarly, one or more current sensor elements that do not require identification are denoted by a reference numeral "22," and one or more bus bars that do not require identification are denoted by a reference numeral "23."

Figure 3:
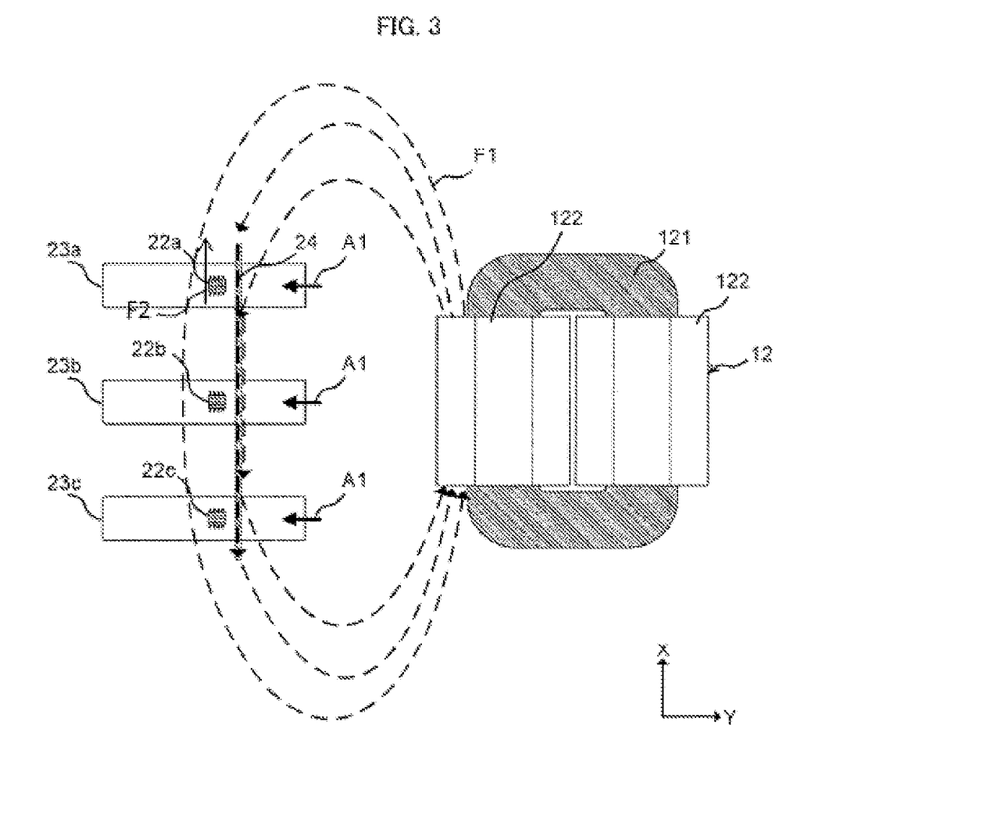
FIG. 3 is a plan view for illustrating the example of the positional relationship between the step-up reactor and the current sensor elements for the electric currents supplied to the load.
Figure 4:
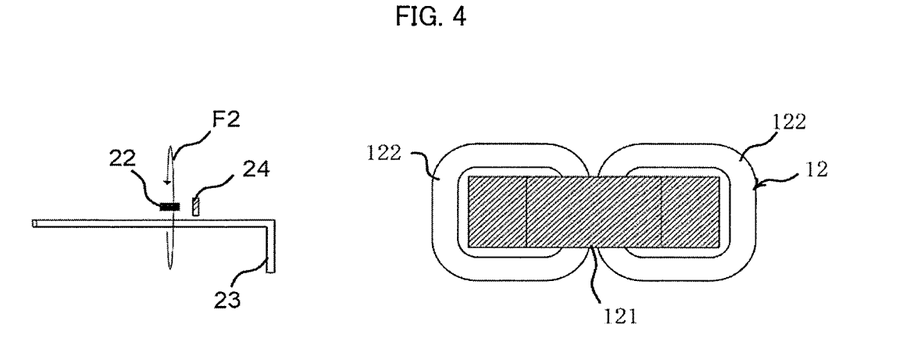
FIG. 4 is a side view for illustrating the example of the positional relationship between the step-up reactor and the current sensor elements for the electric currents supplied to the load.

FIG. 3 is a plan view for illustrating the example of the positional relationship between the step-up reactor and the current sensor elements for the electric currents to be supplied to the load, and FIG. 4 is a side view for illustrating the example of the positional relationship between the step-up reactor and the current sensor elements for the electric currents to be supplied to the load.

The plan view of FIG. 3 is a view as viewed from a positive side on a Z axis in FIG. 2, that is, as viewed from a side of a larger value to a side of a smaller value on the Z axis, and the side view of FIG. 4 is a view as viewed from a negative side on an X-axis direction in FIG. 2. Now referring to FIG. 3 and FIG. 4, the magnetic shield plate 24 is specifically described. In FIG. 3 and FIG. 4, only one magnetic shield plate 24 is illustrated for convenience of description.

In FIG. 3, arrows A1 indicate directions of the electric currents flowing through the bus bars 23a to 23c. Therefore, the electric currents flowing through the bus bars 23a to 23c are also denoted by the reference symbol "A1." Arrows F1 indicate, of magnetic fluxes generated by the step-up reactor 12, magnetic fluxes directed to the current sensor elements 22. An arrow F2 indicates, as also illustrated in FIG. 4, a magnetic flux generated when the electric current A1 flows through the bus bar 23a. In FIG. 3, directions of the magnetic fluxes are indicated by the arrows on an XY plane. The magnetic flux F2 substantially matches a magnetosensitive direction in which the current sensor element 22a detects the magnetic flux with the highest sensitivity. The direction of the magnetic flux F2 is basically the same for the other bus bars 23b and 23c, and the magnetosensitive direction is basically the same for all the current sensor elements 22a to 22c.

As illustrated in FIG. 3 and FIG. 4, the magnetic shield plate 24 is arranged on a straight line connecting the step-up reactor 12 and each of the current sensor elements 22. More specifically, the magnetic shield plate 24 is arranged between the step-up reactor 12 and the current sensor elements 22 along an array direction of the current sensor elements 22a to 22c so as to cross the three bus bars 23a to 23c. The magnetic shield plate 24 has a shape capable of shielding, of the magnetic fluxes F1 generated by the step-up reactor 12, the magnetic fluxes F1 reaching the current sensor elements 22 from within a range of directions in which the current sensor elements 22 are detectable. Therefore, the magnetic shield plate 24 serves to prevent the magnetic fluxes F1 generated by the step-up reactor 12 from being detected by the current sensor elements 22, or to suppress detected magnetic fluxes significantly.

As a position on the step-up reactor 12 connected to each of the current sensor elements 22 by the straight line, the center on an XZ plane of a portion of the step-up reactor 12 generating the magnetic fluxes can be considered, for example. When the same one magnetic shield plate 24 is used for a plurality of current sensor elements 22, the current sensor element 22 located at the center of the plurality of current sensor elements 22, or a position at the center on a direction in which the plurality of current sensor elements 22 are arrayed can be considered. The positions of the step-up reactor 12 and the current sensor elements 22 connected by the straight line may be determined as appropriate, and the positions may be virtual positions.

As illustrated in FIG. 3 and FIG. 4, the magnetic shield plate 24 is a plate-like member. The magnetic shield plate 24 is arranged so as not to shield the magnetic fluxes F2, which are generated when the electric currents A1 flow through the bus bars 23a to 23c, from reaching the current sensor elements 22. As a result, only the magnetic fluxes F2 generated by the bus bars 23 pass through the current sensor elements 22, or most of the magnetic fluxes that pass through the current sensor elements 22 are generated by the bus bar 23. Therefore, through the arrangement of the magnetic shield plate 24, the electric currents A1 can be measured with the use of the current sensor elements 22 with high accuracy.

As opposed to the related-art technology described in Patent Literature 1, determination of the arrangement and the shape of the magnetic shield plate 24 can be made independently of determination of arrangement of the bus bars 23, the current sensor elements 22a to 22c, and the step-up reactor. Therefore, suppression of design flexibility of the power conversion device 100 along with the arrangement of the magnetic shield plate 24 is avoided, or the degree of suppression is at a very low level.

In the first embodiment, as illustrated in FIG. 3 and FIG. 4, the current sensor elements 22a to 22c are arranged on a plane including the magnetic fluxes F1 from the step-up reactor 12. When the current sensor elements 22a to 22c and the bus bars 23a to 23c are arranged in this manner, a common magnetic shield plate 24 can be used for the current sensor elements 22a to 22c. A required length on the Z-axis direction, that is, a height of the magnetic shield plate 24 is also suppressed. As a result, advantages can be obtained in terms of suppression of the number of components and mountability of the magnetic shield plate 24, for example.

Figure 5:
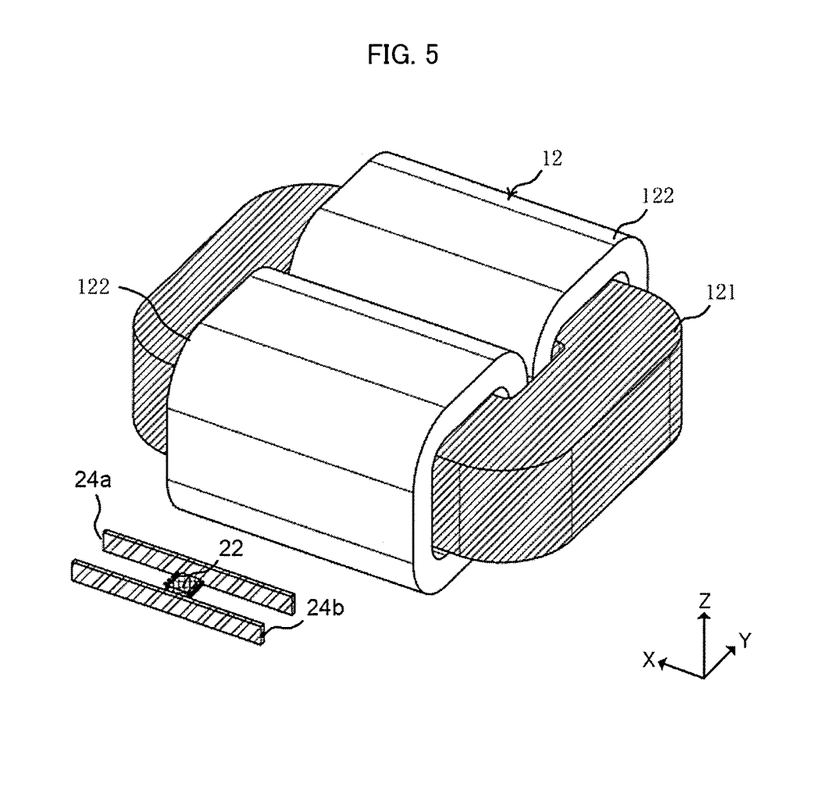
FIG. 5 is a perspective view for illustrating a positional relationship among the step-up reactor, a current sensor element, and two magnetic shield plates for magnetic field simulation.
Figure 6:
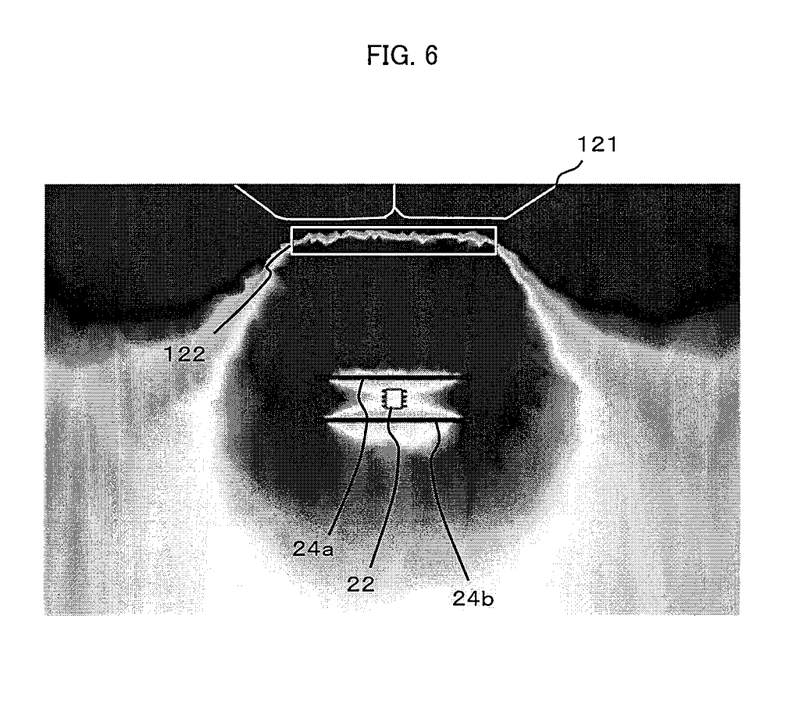
FIG. 6 is a diagram for showing a result of the magnetic field simulation.

FIG. 5 is a perspective view for illustrating a positional relationship among the step-up reactor, a current sensor element, and two magnetic shield plates for magnetic field simulation, and FIG. 6 is a diagram for illustrating a result of the magnetic field simulation. Next referring to FIG. 5 and FIG. 6, a shielding effect provided by the magnetic shield plates 24 is specifically described.

In FIG. 5 and FIG. 6, the same or corresponding components are denoted by corresponding reference symbols. The current sensor element 22 corresponds to the current sensor element 22b illustrated in FIG. 3. In the magnetic field simulation result illustrated in FIG. 6, intensities of the magnetic fluxes in the X-axis direction, which is the magnetosensitive direction of the current sensor element 22, are shown by shades of gray on the XY plane including the current sensor element 22. As the gray becomes denser, it indicates that the magnetic flux becomes stronger. In the magnetic field simulation, in order to facilitate confirmation of the shielding effect provided by the magnetic shield plates 24, the bus bar 23 is not simulated.

As shown in FIG. 6, with the magnetic shield plate 24a shielding the magnetic fluxes F1 from the step-up reactor 12, magnetic fluxes on a negative side on a Y axis of the magnetic shield plate 24a are very small. Between the two magnetic shield plates 24a and 24b, a range on an X axis in which magnetic fluxes are very small becomes gradually narrower, and then becomes gradually wider toward the negative side on the Y axis.

The range on the X axis in which the magnetic fluxes are very small becomes gradually wider toward the negative side on the Y axis because the magnetic fluxes F1 are diverted to the inside of the magnetic shield plate 24b. With the diversion, the range on the X axis in which the magnetic fluxes are very small becomes wider as the magnetic fluxes approach closer to the magnetic shield plates 24 on the Y axis.

This shows that the change in range on the X axis in which the magnetic fluxes are very small depending on the position on the Y axis as shown in FIG. 6 is effective not only for the magnetic shield plate 24a but also for the magnetic shield plate 24b. In other words, both of the magnetic shield plate 24a and the magnetic shield plate 24b suppress unnecessary magnetic fluxes within a sensitivity region in which the current sensor element 22 can detect the magnetic fluxes. From this fact, in measuring the electric current A1 with higher accuracy, it is very effective to arrange the two magnetic shield plates 24 so as to sandwich the current sensor element 22.

From the magnetic field simulation of a model as illustrated in FIG. 5, it was confirmed that it is preferred to set a length of each of the magnetic shield plates 24 on the magnetosensitive direction of the current sensor element 22 longer than twice a length of the current sensor element 22 on the magnetosensitive direction. The magnetosensitive direction is preferably a magnetosensitive direction in which the magnetic fluxes are detected with the highest sensitivity. The preferred length of the magnetic shield plates 24 becomes longer as the distance to the current sensor element 22 becomes longer. The length of the current sensor element in the magnetosensitive direction is hereinafter referred to as "element length."

As illustrated in FIG. 2 and FIG. 3, one magnetic shield plate 24 may be provided for three current sensor elements 22a to 22c. In this case, the preferred length of the magnetic shield plate 24 is a length obtained by adding, to an end-to-end length in the array direction of the three current sensor elements 22a to 22c, a length that is larger than the element length. In other words, the preferred length of the magnetic shield plate 24 is, irrespective of the number of current sensor elements 22 as targets thereof, a length obtained by adding, to a length of a range in which the current sensor elements 22 as targets are located, the length that is larger than the element length.

In the first embodiment, two magnetic shield plates 24 are arranged, but one magnetic shield plate 24 may be arranged. In this case, it is preferred that the magnetic shield plate 24 be larger. The position thereof may be, as viewed from the step-up reactor 12, before the current sensor element 22, but may be behind the current sensor element 22.

Further, one or more magnetic shield plates 24 may be provided for each current sensor element 22. Each of the magnetic shield plates 24 may have a curved shape instead of the planer shape. Each of the magnetic shield plates 24 may have a shape obtained by combining a plurality of planes. Therefore, various modifications can be made to the way in which the magnetic shield plates 24 are arranged, and to shapes and other factors of the magnetic shield plates 24.

Further, the power conversion device 100 includes the DC/DC step-up converter circuit 10 and the inverter circuit 20, but the power conversion device 100 to which the first embodiment is applicable is not limited to such a device. For example, the power conversion device 100 may include an AC/DC converter circuit or an insulated DC/DC converter circuit, for example, or may include three or more circuits. In other words, the power conversion device 100 may be any device including a current sensor element used to detect the electric current A1 in a non-contact manner, and a magnetic component affecting a detection result of the current sensor element.

Second Embodiment

When the semiconductor switching elements 13a to 13d of the DC/DC step-up converter circuit 10 are caused to perform a switching operation, electric currents having ripple components flow through the two windings 122 included in the step-up reactor 12. Therefore, the magnetic fluxes F1 generated by the step-up reactor 12 change depending on the ripple components. When the magnetic fluxes F1 generated by the step-up reactor 12 cannot be completely shielded, the change of the magnetic fluxes F1 varies a magnitude of an error included in the detection result of the current values, and a magnetic shield plate 24 is caused to generate heat. Therefore, a second embodiment of the present invention is intended to suppress the variation in magnitude of the error included in the detection result of the current values to further increase accuracy, and further suppress the heat generation of the magnetic shield plate 24. Here, components that are the same as or corresponding to those of the first embodiment described above are denoted by the same reference symbols, and components different from those of the first embodiment are described in detail. The same applies to other embodiments to be described later.

Figure 7:
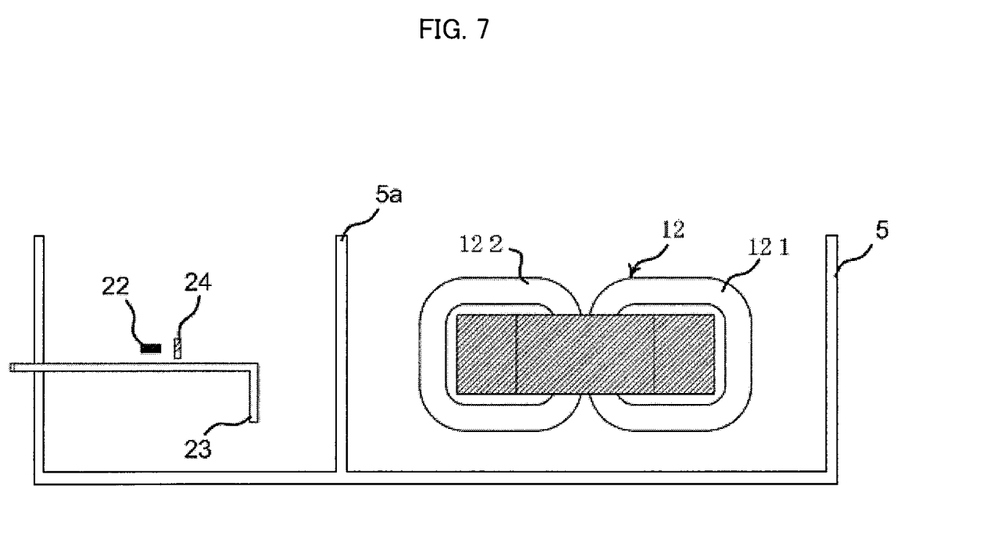
FIG. 7 is a cross-sectional view for illustrating an arrangement example of a step-up reactor, a bus bar, a current sensor element, and a magnetic shield plate in a casing, in which a power conversion device according to a second embodiment of the present invention is housed.

FIG. 7 is a cross-sectional view for illustrating an arrangement example of a step-up reactor, a bus bar, a current sensor element, and a magnetic shield plate in a casing, in which a power conversion device according to the second embodiment of the present invention is housed. The cross-sectional view is a view as viewed from the negative side on the X-axis direction.

The power conversion device 100 is provided in a casing 5. In the second embodiment, as illustrated in FIG. 7, a metal shield plate 5a is arranged in addition to a magnetic shield plate 24 on a straight line connecting a step-up reactor 12 and a current sensor element 22. In other words, the metal shield plate 5a is arranged between the step-up reactor 12 and the current sensor elements 22 along the array direction of the current sensor elements 22a to 22c in parallel with, or substantially in parallel with, the magnetic shield plate 24. Further, the metal shield plate 5a is arranged between the step-up reactor 12 and the magnetic shield plate 24.

The metal shield plate 5a is a plate-like member which is made of a material that is aluminum, copper, stainless steel, or other non-magnetic substance and has a high electric conductivity, and has a size that covers a range in which magnetic fluxes F1 directed from the step-up reactor 12 to the current sensor elements 22 pass. Therefore, the metal shield plate 5a is configured to shield the magnetic fluxes F1 directed from the step-up reactor 12 to the current sensor elements 22 by a magnetic shield effect with an eddy current. Therefore, the magnetic fluxes F1 that are generated by the step-up reactor 12 and accompany a change in time are shielded by the metal shield plate 5a, and do not affect the current sensor elements 22 and the magnetic shield plate 24, or have their effects significantly suppressed. As a result, as compared to the first embodiment described above, in the second embodiment, the current values can be measured with higher accuracy.

The metal shield plate 5a is embodied as a part of the casing 5, but may be made as an individual component. When the metal shield plate 5a is embodied as a part of the casing 5, it is advantageous in terms of reducing the number of components and suppressing an assembly cost.

Third Embodiment

Figure 8:
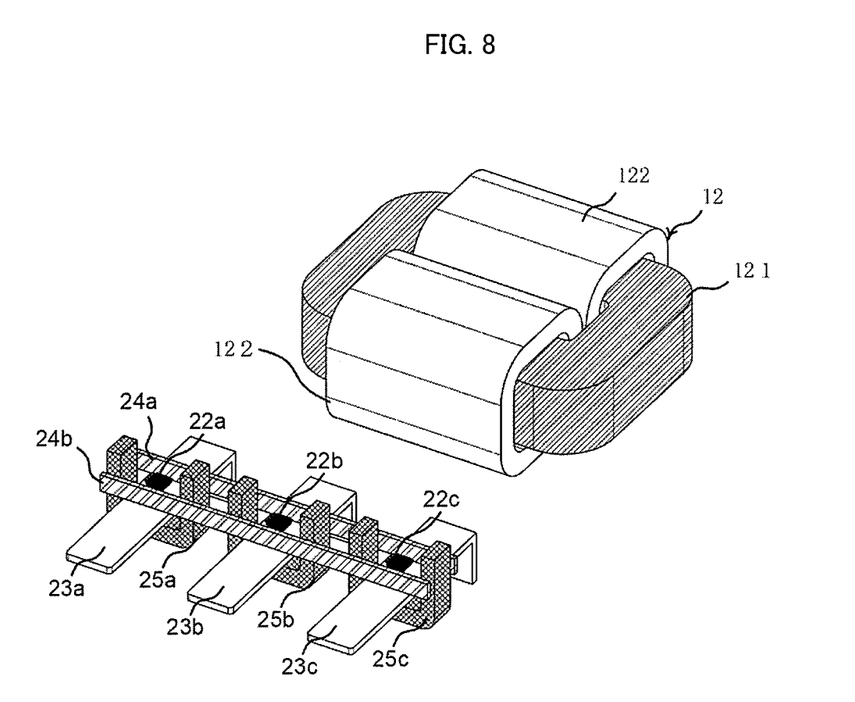
FIG. 8 is a perspective view for illustrating an example of a positional relationship between a peripheral configuration example including bus bars and a step-up reactor in a power conversion device according to a third embodiment of the present invention.

FIG. 8 is a perspective view for illustrating an example of a positional relationship between a peripheral configuration example including bus bars and a step-up reactor in a power conversion device according to a third embodiment of the present invention.

In the third embodiment, as illustrated in FIG. 8, two magnetic shield plates 24a and 24b are arranged at positions sandwiching the current sensor elements 22, and magnetic flux concentrating cores 25a to 25c are further arranged around the current sensor elements 22, respectively.

Each of the magnetic flux concentrating cores 25a to 25c is a component configured to amplify the number of magnetic fluxes generated by a corresponding bus bar 23, and supply the amplified number of magnetic fluxes to the corresponding current sensor element 22. To that end, each of the magnetic flux concentrating cores 25a to 25c is arranged on magnetic paths of the magnetic fluxes F2 supplied to the current sensor element 22 of the magnetic fluxes F2 generated by the bus bar 23.

With the use of the magnetic flux concentrating cores 25a to 25c, signal-to-noise ratios (S/N ratios) of the current sensor elements 22 can be further increased. Therefore, the current values of the bus bars 23 can also be detected with higher accuracy. Further, the magnetic flux concentrating cores 25a to 25c themselves have the effect of a magnetic shield. This means that, with the use of the magnetic flux concentrating cores 25a to 25c, resistance to the disturbance magnetic field is further increased. This also serves to detect the current values of the bus bars 23 with higher accuracy.

Each of the magnetic shield plates 24 is arranged, as illustrated in FIG. 8, so as to avoid the magnetic paths of the magnetic fluxes F2 concentrated by the magnetic flux concentrating cores 25a to 25c. Therefore, the magnetic shield plates 24 are prevented from reducing the S/N ratios of the current sensor elements 22.

Fourth Embodiment

Figure 9:
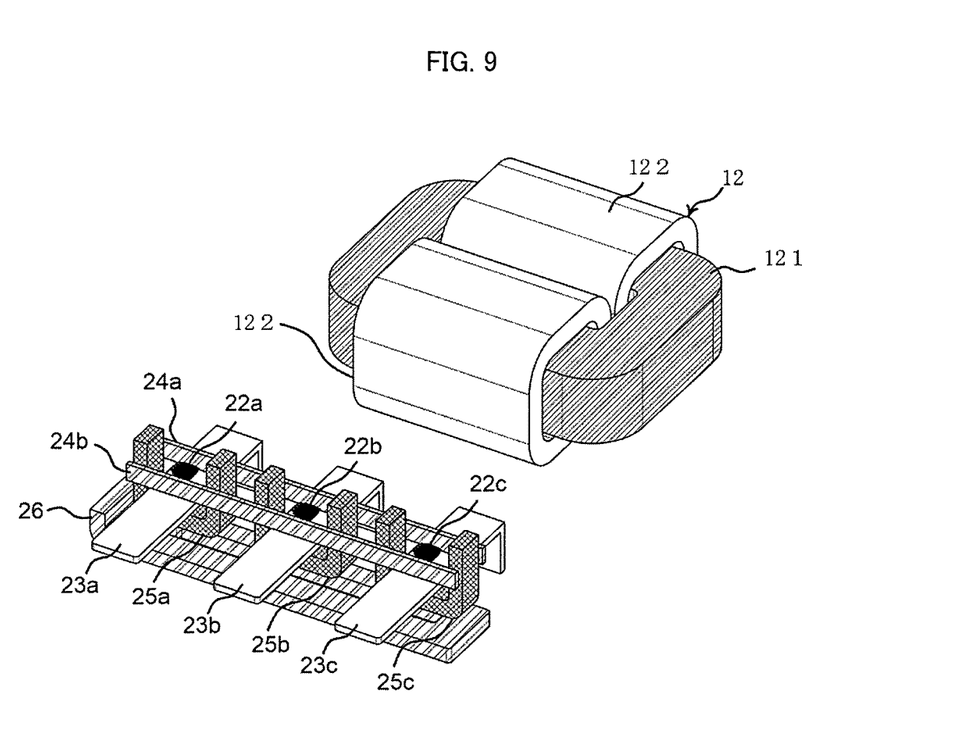
FIG. 9 is a perspective view for illustrating a configuration example of bus bars and their surroundings and an example of a positional relationship of the bus bars and their surroundings with respect to a step-up reactor in a power conversion device according to a fourth embodiment of the present invention.

FIG. 9 is a perspective view for illustrating an example of a positional relationship between a peripheral configuration example including bus bars and a step-up reactor in a power conversion device according to a fourth embodiment of the present invention.

In the fourth embodiment, as illustrated in FIG. 9, with respect to the third embodiment described above, a magnetic shield plate 26 covering a range including the magnetic flux concentrating cores 25a to 25c is added. The magnetic shield plate 26 is arranged on the negative side on the Z axis of the magnetic flux concentrating cores 25a to 25c.

The magnetic flux concentrating cores 25a to 25c are components made by laminating a plurality of types of magnetic members, for example. When the magnetic fluxes are supplied to the magnetic members, the magnetic fluxes supplied to the current sensor elements 22 are changed. Through arrangement of the magnetic shield plate 26, the magnetic fluxes caused by the disturbance magnetic field can be prevented from reaching the magnetic flux concentrating cores 25a to 25c. Therefore, as compared to the third embodiment described above, the current values of the bus bars 23 can be measured with higher accuracy.

A length of each of the magnetic flux concentrating cores 25a to 25c on the magnetosensitive direction of the current sensor element 22 is referred to as "core length." A preferred length of the magnetic shield plate 26 on the magnetosensitive direction is, when one of the magnetic flux concentrating cores 25a to 25c is a target thereof, a length that is larger than twice the core length. As illustrated in FIG. 9, when one magnetic shield plate 26 is provided for the magnetic flux concentrating cores 25a to 25c, the preferred length of the magnetic shield plate 26 is a length obtained by adding, to a length of a range in which the magnetic flux concentrating cores 25a to 25c as targets thereof are located, a length that is larger than the core length.

In the first to fourth embodiments described above, a step-up reactor is assumed as the magnetic component that generates the disturbance magnetic field affecting the current sensor elements 22, but the assumed magnetic component is not limited to the step-up reactor. The assumed magnetic component can be determined by a magnetic component used in the power conversion device 100, a positional relationship thereof, and other factors. In other words, the magnetic component may be a reactor or transformer using a dust core having a relatively low permeability, for example. A plurality of magnetic components may be assumed. For example, the magnetic shield plate 26 may be arranged to shield magnetic fluxes generated by another magnetic component.

Further, the first to fourth embodiments described above may be combined with one another. For example, the metal shield plate 5a may be used in the third and fourth embodiments described above. In this case, only one magnetic shield plate 24 may be arranged.

REFERENCE SIGNS LIST

1 power source, 2 load, 5 casing, 5a metal shield plate, 10 DC/DC step-up converter circuit, 12 step-up reactor (magnetic component), 20 inverter circuit, 22, 22a to 22c current sensor element, 23, 23a to 23c bus bar, 24, 24a, 24b, 26 magnetic shield plate, 25a to 25c magnetic flux concentrating core, 100 power conversion device, 121 magnetic core, 122 winding

The invention claimed is:

1. A power conversion device which is configured to convert electric power supplied from a power source with use of a magnetic component, the power conversion device comprising:
a plurality of bus bars configured to supply the electric power to a load;
one or more current sensor elements which are respectively provided for the plurality of bus bars, wherein the one or more current sensor elements are configured to detect first magnetic fluxes generated when electric currents flow through the plurality of bus bars; and
a plate-like magnetic shield plate oriented in an X direction, wherein the plate-like magnetic shield plate is arranged on a straight line connecting the magnetic component and the one or more current sensor elements, wherein the straight line is in a Y direction perpendicular to the X direction, and wherein the plate-like magnetic shield plate is configured to shield second magnetic fluxes directed from the magnetic component to the one or more current sensor elements.

2. The power conversion device according to claim 1, wherein the plate-like magnetic shield plate has a shape determined based on a magnetosensitive direction of the one or more current sensor elements in which the first magnetic fluxes are detectable, and the shape is also determined based on the second magnetic fluxes directed from the magnetic component to the one or more current sensor elements.

3. The power conversion device according to claim 2, wherein the plate-like magnetic shield plate has a first length on the magnetosensitive direction obtained by adding, to a second length on the magnetosensitive direction of a range in which the one or more current sensor elements as targets of the plate-like magnetic shield plate are located, a third length, wherein the third length is larger than a fourth length on the magnetosensitive direction of each of the one or more current sensor elements.

4. The power conversion device according to claim 1 wherein the plate-like magnetic shield plate is arranged so as to avoid a magnetosensitive direction of the one or more current sensor elements in which the second magnetic fluxes are detectable.

5. The power conversion device according to claim 1, wherein a plurality of he plate-like magnetic shield plates are arranged and the plurality of plate-like magnetic shield plates includes the plate-like magnetic shield plate and a second plate-like magnetic shield plate.

6. The power conversion device according to claim 5, wherein the plate-like magnetic shield plate and the second plate-like magnetic shield plate are arranged to be opposed to each other at positions sandwiching the one or more current sensor elements.

7. The power conversion device according to claim 6, wherein the one or more current sensor elements include a first current sensor element, the plurality of bus bars includes a first bus bar, the plate-like magnetic shield plate and the second plate-like magnetic shield plate are further arranged to be opposed to each other at positions sandwiching the first current sensor element while not being above the first bus bar in a Z direction.

8. The power conversion device according to claim 1, wherein the plurality of bus bars are arranged side by side, and
wherein the plate-like magnetic shield plate is arranged, for the one or more current sensor elements as targets thereof which are respectively provided for the plurality of bus bars, so as to cross the plurality of bus bars.

9. The power conversion device according to claim 1, further comprising a metal plate arranged between the magnetic component and the plate-like magnetic shield plate.

10. The power conversion device according to claim 9, wherein the metal plate is a part of a casing.

11. The power conversion device according to claim 1, further comprising magnetic flux concentrating cores which are respectively provided for the one or more current sensor elements, and are configured to concentrate the first magnetic fluxes generated when the electric currents flow through the plurality of bus bars.

12. The power conversion device according to claim 11, further comprising another magnetic shield plate arranged for at least one of the magnetic flux concentrating cores as a target thereof.

13. The power conversion device according to claim 12, wherein the another magnetic shield plate has a first length in a magnetosensitive direction obtained by adding, to a second length on the magnetosensitive direction of a range in which the at least one of the magnetic flux concentrating cores as the target of the another magnetic shield plate is located, a third length, wherein the third length is larger than a length on the magnetosensitive direction of each of the magnetic flux concentrating cores.

14. The power conversion device according to claim 12, wherein the another magnetic shield plate is made of a magnetic material.

15. The power conversion device according to claim 12, wherein the another magnetic shield plate is arranged in a YZ plane, and wherein the another magnetic shield plate is made of a non-magnetic material such that the another metal shield plate is configured to shield the second magnetic fluxes by a magnetic shield effect with an eddy current.

16. The power conversion device according to claim 1, wherein the plate-like magnetic shield plate is made of a magnetic material.

17. The power conversion device according to claim 1, wherein the magnetic component is a reactor including a common magnetic core and a plurality of windings having a turn ratio of 1:1, the plurality of windings being configured to generate the second magnetic fluxes in directions of cancelling each other in the common magnetic core.

18. The power conversion device according to claim 1, wherein the magnetic component includes a common magnetic core, windings of the magnetic component are wound around a portion of the common magnetic core, and a positional relationship between the plate-like magnetic shield plate and the magnetic component is such that the portion of the common magnetic core is aligned in the Y direction.

19. The power conversion device according to claim 1, wherein the one or more current sensor elements include a first current sensor element, the plurality of bus bars includes a first bus bar, and the first current sensor element is disposed in a Z direction on a surface of the first bus bar.

20. The power conversion device according to claim 19, the first bus bar is configured with a uniform cross section in a YZ plane.

* * * * *